US010324138B2

(12) United States Patent
Richards et al.

(10) Patent No.: US 10,324,138 B2
(45) Date of Patent: Jun. 18, 2019

(54) COMPUTING SYSTEM FOR IDENTIFICATION OF SOLID-SOLID INTERPHASE PRODUCTS

(71) Applicants: Samsung Electronics Co., Ltd., Suwon-si, Gyeonggi-do (KR); Massachusetts Institute of Technology, Cambridge, MA (US)

(72) Inventors: William D. Richards, Cambridge, MA (US); Lincoln J. Miara, Cambridge, MA (US); Yan E. Wang, Cambridge, MA (US); Jae Chul Kim, Emeryville, CA (US); Gerbrand Ceder, Orinda, CA (US)

(73) Assignee: MASSACHUSETTES INSTITUTE OF TECHNOLOGY, Cambridge, MA (US)

( * ) Notice: Subject to any disclaimer, the term of this patent is extended or adjusted under 35 U.S.C. 154(b) by 197 days.

(21) Appl. No.: 15/352,400

(22) Filed: Nov. 15, 2016

(65) Prior Publication Data

US 2017/0139013 A1    May 18, 2017

Related U.S. Application Data

(60) Provisional application No. 62/256,066, filed on Nov. 16, 2015.

(51) Int. Cl.
*H01M 10/42* (2006.01)
*G01R 31/367* (2019.01)
(Continued)

(52) U.S. Cl.
CPC ...... *G01R 31/367* (2019.01); *H01M 10/0562* (2013.01); *H01M 10/4285* (2013.01); *H01M 10/0525* (2013.01)

(58) Field of Classification Search
CPC .................................................. G01R 31/367
See application file for complete search history.

(56) References Cited

U.S. PATENT DOCUMENTS 7,129,005 B2    10/2006  Wensley et al.
7,595,611 B2     9/2009  Reynier et al.
(Continued)

OTHER PUBLICATIONS

Richards, William D. et al., "Interface stability in solid-state batteries", Abstract, Dept of Materials Science and Engineering, Massachusetts Institute of Technology, Cambridge, MA 02139; Samsung Advanced Institute of Technology—USA, Cambridge, MA 02142; Dept. of Materials Science and Engineering, University of California, Berkeley, Berkeley, CA 94720 and Materials Sciences Division, Lawrence Berkeley National Laboratory, Berkeley, CA, 94720, pp. 1-39.

*Primary Examiner* — Manuel A Rivera Vargas
(74) *Attorney, Agent, or Firm* — Cantor Colburn LLP (57) ABSTRACT

Embodiments of a method, a system, and non-transitory computer readable storage media evaluating electrochemical qualities for interphase products. The disclosed embodiments perform a selection of a plurality of chemical phases for a solid electrolyte and at least one of the anode and cathode to be received. Thermodynamic data is received for the plurality of chemical phases. The retrieved thermodynamic data is received to evaluate a respective electrochemical quality for at least one of an interface between the solid electrolyte and the anode, and an interface between the solid electrolyte and the cathode.

13 Claims, 8 Drawing Sheets

(51) Int. Cl.
*H01M 10/0525* (2010.01)
*H01M 10/0562* (2010.01)

(56) References Cited

U.S. PATENT DOCUMENTS

| | | |
|---|---|---|
| 8,435,679 B2 | 5/2013 | Lamanna et al. |
| 8,446,127 B2 | 5/2013 | Yazami et al. |
| 2011/0288797 A1* | 11/2011 | Schmidt ............ H01M 10/0525 702/63 |
| 2012/0100436 A1 | 4/2012 | Inoue et al. |
| 2013/0224633 A1 | 8/2013 | Lee et al. |
| 2013/0304434 A1 | 11/2013 | Miara et al. |
| 2013/0316072 A1 | 11/2013 | Scordilis-Kelley et al. |
| 2013/0322488 A1 | 12/2013 | Yazami et al. |
| 2014/0154533 A1 | 6/2014 | Schaefer et al. |
| 2015/0155559 A1 | 6/2015 | Zimmerman et al. |
| 2015/0204809 A1 | 7/2015 | Miara et al. |
| 2015/0249261 A1 | 9/2015 | Dai et al. |
| 2015/0280218 A1 | 10/2015 | Zimmerman et al. |
| 2015/0357675 A1 | 12/2015 | Ohtomo et al. |
| 2015/0364748 A1 | 12/2015 | Amiruddin et al. |
| 2016/0006026 A1 | 1/2016 | Paulsen et al. |
| 2016/0093888 A1 | 3/2016 | Oyama et al. |

* cited by examiner

Li-deficient
decomposition layer

COMPUTING SYSTEM FOR IDENTIFICATION OF SOLID-SOLID INTERPHASE PRODUCTS

RELATED APPLICATIONS

This application claims the benefit, under 35 U.S.C. § 119(e), of U.S. Provisional Patent Application Ser. No. 62/256,066 entitled "Computing System for High-Throughput Identification of Solid-Solid Interphase Products," filed on Nov. 16, 2015, which is hereby incorporated by reference in its entirety.

BACKGROUND

Solid-state electrolytes have the potential to dramatically improve safety and performance of state-of-the-art battery technology. The high energy density and long cycle life of lithium-ion batteries, for example, has led to their adoption in all manner of technologies, but serious safety concerns still exist due to their use of flammable organic solvent electrolytes. This is especially problematic for grid-scale storage, and transport applications including aircraft and automobiles.

Solid-state ionic electrolyte materials may be a viable non-flammable alternative to organic electrolytes. In addition, solid-state ionic electrolyte materials may enable novel device geometries to improve packing efficiency of the electrochemical cells. Furthermore, solid-state ionic electrolyte materials may potentially improve cycle life and allow the use of higher voltage cathodes. By suppressing dendrite formation, solid-state ionic state materials may allow the use of metal anodes, which could increase energy density considerably.

For this reason, a predictive modeling approach that formally includes the chemical and electrochemical driving force can be highly valuable. There is a need for methods and systems that would allow for high throughput computerized screening of candidate solid-state compounds associated with a thermodynamic chemical conditions present in electrochemical cells of interest.

SUMMARY

A method is provided using a device having one or more processors and memory storing instructions for execution by the one or more processors. The method includes receiving a selection of a plurality of chemical phases for a solid electrolyte and at least one of an anode and cathode, wherein the solid electrolyte, the anode, and the cathode compose an electrochemical cell. Thermodynamic data is received for the plurality of chemical phases from a database. The thermodynamic data is used to evaluate a selected electrochemical quality for at least one of an interface between the solid electrolyte and the anode, and an interface between the solid electrolyte and the cathode.

In another embodiment, a system is provided including a processor and memory for storing one or more programs for execution by the processor. The one or more programs include instructions for receiving a selection of a plurality of chemical phases for a solid electrolyte and at least one of an anode and cathode, wherein the solid electrolyte, the anode, and the cathode compose an electrochemical cell. The instructions may also allow thermodynamic data to be received for the plurality of chemical phases from a database. The retrieved thermodynamic data may be used to evaluate a selected electrochemical quality for at least one of an interface between the solid electrolyte and the anode, and an interface between the solid electrolyte and the cathode.

Another embodiment includes a non-transitory computer readable storage medium storing one or more programs for execution by one or more processors. The one or more programs include instructions for: receiving a selection of a plurality of chemical phases for a solid electrolyte and at least one of an anode and cathode, wherein the solid electrolyte, the anode, and the cathode compose an electrochemical cell; retrieving thermodynamic data for the plurality of chemical phases from a database; and using the retrieved thermodynamic data to evaluate a respective electrochemical quality for at least one of an interface between the solid electrolyte and the anode, and an interface between the solid electrolyte and the cathode.

DETAILED DESCRIPTION

Definitions and Overview

The terminology used herein, including those set is forth in the section below, are provided for the purpose of describing particular embodiments only, and is not intended to be limiting. In addition, in this specification and in the claims that follow, reference is made to a number of terms that are defined to have the following meanings, unless the context in which they are employed clearly indicates otherwise.

Unless expressly indicated otherwise or indicated otherwise by context, the term "anode" is used interchangeably with the term "negative electrode," and the term "cathode" is used interchangeably with the term "positive electrode."

The term "database" as used herein includes a computer accessible set of data records, each data record including at least one data object.

The term "phase" is used in its ordinary material science and engineering sense and may also refer to the microstructure of a solid composition of matter, for example, a chemical compound with some ionic characteristics. A "phase diagram" represents in graphical form the limits of stability of the various phases in a chemical system at equilibrium, with respect to variables such as composition and temperature.

In some embodiments, the term "room temperature" refers to a temperature within a range of −20° C. to 60° C. (−4° F. to 140° F.). As one example, "room temperature" refers to a temperature of about 25° C. or 298 K.

The term "about" refers to a range of ±5%.

The term "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

An example method evaluates the thermodynamic stability of battery interfaces. The method may be used to model and/or predict experimentally observable trends. It has been discovered that the bulk thermodynamic driving force for a reaction between the electrolyte and cathode is a good proxy for interfacial stability, and that this contribution to the reaction energy dominates the effects of interfacial energy. The method may be applied over a broad range of cathode/electrolyte combinations. Thus, new strategies for improving electrochemical cell and battery performance may be suggested for batteries including lithium, sodium, and other systems involving alkali ion transport.

The example method includes calculations stemming from thermodynamic data for the electrolytes and possible decomposition products. Such data may be provided in the form of a database of thermodynamic phase diagram data for a plurality of chemicals associated with the electrolyte and at least one of the anode and the cathode. In some embodiments, the underlying data in the database may be obtained by leveraging the scalability and transferability of Density Functional Theory (hereafter "DFT") calculations to augment available experimental values. This enables the examination of a wide range of cathode and electrolyte combinations including materials whose thermodynamic properties have not yet been determined experimentally, while retaining similar accuracy to experimental data in systems where this data is available. Thermodynamic properties of interest may include, for example, ionic transport conductivity of the solid-solid interphase compound product, for example a solid-solid interphase compound product having a minimum conductivity of about 0.001 mS/cm at room temperature.

Results of the bulk thermodynamic calculations may be used explain the poor performance seen in many solid-state battery systems, and the generalization of the observed trends lead to design rules for constructing new battery systems. It has been found that find that the chemical composition of electrode and electrolyte phases is one of the determinants of interfacial stability, but that the performance of these interfaces can be improved by engineering systems where the decomposition phases are passivating (electronically insulating) but still ionically conductive. In particular, it has been found that the choice of anion is one factor determining the high voltage stability limit. When paired with high voltage cathodes, for example, thiophosphate electrolytes have a high driving force for reaction to form ionically insulating barrier layers, explaining the high internal resistance seen experimentally.

Example methods may also be used to identify a number of potentially high performance cathode/solid-electrolyte combinations which have yet to be attempted experimentally. These results are also useful for suggesting combinations of electrolytes to widen the effective stability window of the cell.

Thus, an example method is provided that includes: receiving a selection of a plurality of chemical phases for a solid electrolyte and at least one of an anode and cathode, wherein the solid electrolyte, the anode, and the cathode compose an electrochemical cell; retrieving thermodynamic data for the plurality of chemical phases from a database; and using the retrieved thermodynamic data to evaluate a selected electrochemical quality for at least one of an interface between the solid electrolyte and the anode, and an interface between the solid electrolyte and the cathode. An example electrochemical quality is a degree of thermodynamic stability. The retrieved thermodynamic data is used to evaluate the selected electrochemical quality. A mixing reaction energy is determined for at least one of the interface between the solid electrolyte and the anode, and the interface between the solid electrolyte and the cathode, wherein the mixing reaction energy provides an indication of the degree of thermodynamic stability.

For example, the method may be used in a manner such that a phase diagram is generated based on elements of the corresponding chemical phases of the interface or interfaces being evaluated. Based on the phase diagram, a grand potential phase diagram open to a selected element may be generated. The phase diagram and/or the grand potential phase diagram may be used to identify a stable combination of chemical phases, for example, by identifying in the phase diagram a tie line connecting the chemical phases of a stable combination.

The mixing reaction energy may be determined from mixing reaction energies for multiple combinations of chemical phases, with the multiple combinations formed based on elements of the selected plurality of chemical phases. Other example steps or substeps of the example method may include: identifying a first combination from the multiple combinations of chemical phases that satisfies a thermodynamic stability criterion; calculating respective stability ranges for a plurality of candidate phases for a solid electrolyte; and/or based on the calculated stability ranges, identifying, from the plurality of candidate phases, a chemical phase whose calculated stability range satisfies a predefined criterion, wherein the selected chemical phase corresponds to the identified chemical phase.

A system embodiment may be provided, and may include, for example but not limited to, a processor, and memory for storing one or more programs for execution by the processor. The system embodiment may be implemented as hardware in an electronic circuit including a plurality of semiconductor devices. The program or programs include instructions for: receiving a selection of a plurality of chemical phases for a solid electrolyte and at least one of an anode and cathode, wherein the solid electrolyte, the anode, and the cathode compose an electrochemical cell; retrieving thermodynamic data for the plurality of chemical phases from a database; and using the retrieved thermodynamic data to evaluate a respective electrochemical quality for at least one of an interface between the solid electrolyte and the anode, and an interface between the solid electrolyte and the cathode.

Another example embodiment includes a non-transitory computer readable storage medium storing one or more programs for execution by one or more processors. The program(s) may include instructions for: receiving a selection of a plurality of chemical phases for a solid electrolyte and at least one of an anode and cathode, wherein the solid electrolyte, the anode, and the cathode compose an electrochemical cell; retrieving thermodynamic data for the plurality of chemical phases from a database; and using the retrieved thermodynamic data to evaluate a respective electrochemical quality for at least one of an interface between the solid electrolyte and the anode, and an interface between the solid electrolyte and the cathode.

Example embodiments including apparatus, systems, methods, and computer readable mediums are disclosed herein that facilitate evaluation of materials for the development of solid state batteries. The design of solid-state electrolyte materials is challenging due to the extreme conditions such materials experience in contact with both the anode and cathode. The materials can correspond to materials that are candidates to be used in combination as an electrolyte and electrode in a battery.

Thus, example embodiments allow proposed candidate materials to be evaluated to determine whether actual test cells using the candidate materials should be built. The evaluation may take place in many ways. For example, the system may receive user input indicative of two or more materials for evaluation and indicative of a request to evaluate the materials. In another example, the system, in response to receiving a user request, searches a database of candidate materials for use as an electrolyte and an electrode in a battery. The system can identify one or more suitable combinations or can provide scores, other quantitative feedback, and/or qualitative feedback for various combinations.

Figure 3A:
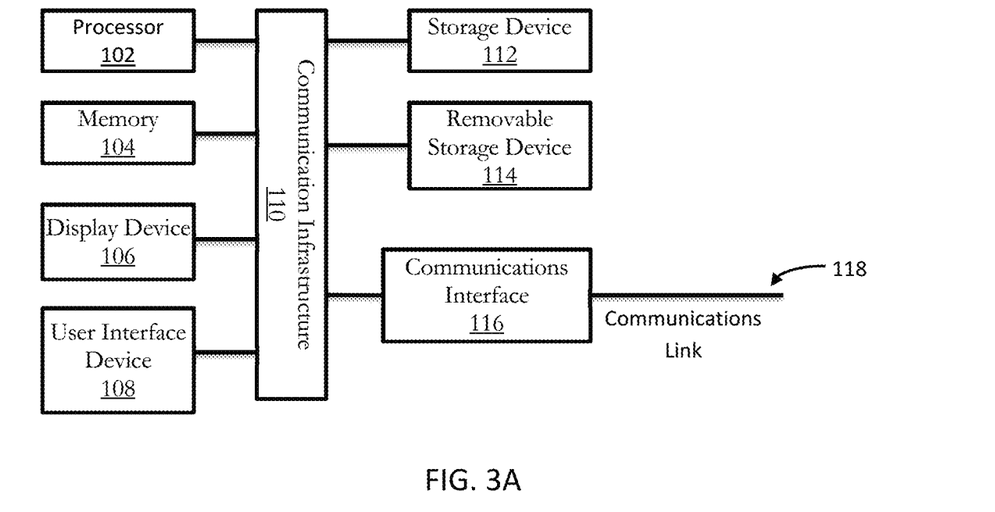
FIGS. 3A and 3B depict an example electronic system and components that may be used in various methods to evaluate electrochemical qualities for solid-solid interphase products.

FIG. 3A is an exemplary high-level block diagram showing an information processing system comprising a computer system 100 useful for implementing the disclosed embodiments. The computer system 100 includes one or more processors 102, and can further include an electronic display device 106 (for displaying graphics, text, and other data), a main memory 104 (e.g., random access memory (RAM)), storage device 112 (e.g., hard disk drive, solid state drive, etc.), removable storage device 114 (e.g., removable storage drive, removable memory module, a magnetic tape drive, optical disk drive, computer readable medium having stored therein computer software and/or data), user interface device 108 (e.g., keyboard, touch screen, keypad, pointing device), and a communication interface 116 (e.g., modem, a network interface (such as an Ethernet card), a communications port, or a PCMCIA slot and card). The communication interface 116 allows software and data to be transferred between the computer system and external devices. The system 100 further includes a communications infrastructure 110 (e.g., a communications bus, cross-over bar, or network) to which the aforementioned devices/modules 102 through 116 are connected.

Information transferred via communications interface 116 may be in the form of signals such as electronic, electromagnetic, optical, or other signals capable of being received by communications interface 116, via a communication link 118 that carries signals and may be implemented using wire or cable, fiber optics, a phone line, a cellular phone link, an radio frequency (RF) link, and/or other communication channels. Computer program instructions representing the block diagram and/or flowcharts herein may be loaded onto a computer, programmable data processing apparatus, or processing devices to cause a series of operations performed thereon to produce a computer implemented process.

Embodiments have been described with reference to flowchart illustrations and/or block diagrams of methods, apparatus (systems) and computer program products according to embodiments. Each block of such illustrations/diagrams, or combinations thereof, can be implemented by computer program instructions. The computer program instructions when provided to a processor produce a machine, such that the instructions, which execute via the processor, create means for implementing the functions/operations specified in the flowchart and/or block diagram. Each block in the flowchart/block diagrams may represent a hardware and/or software module or logic, implementing embodiments. In alternative implementations, the functions noted in the blocks may occur out of the order noted in the figures, concurrently, etc.

Computer programs (i.e., computer control logic) are stored in main memory and/or secondary memory. Computer programs may also be received via a communications interface. Such computer programs, when executed, enable the computer system to perform the features of the embodiments as discussed herein. In particular, the computer programs, when executed, enable the processor and/or multi-core processor to perform the features of the computer system. Such computer programs represent controllers of the computer system.

Figure 3B:
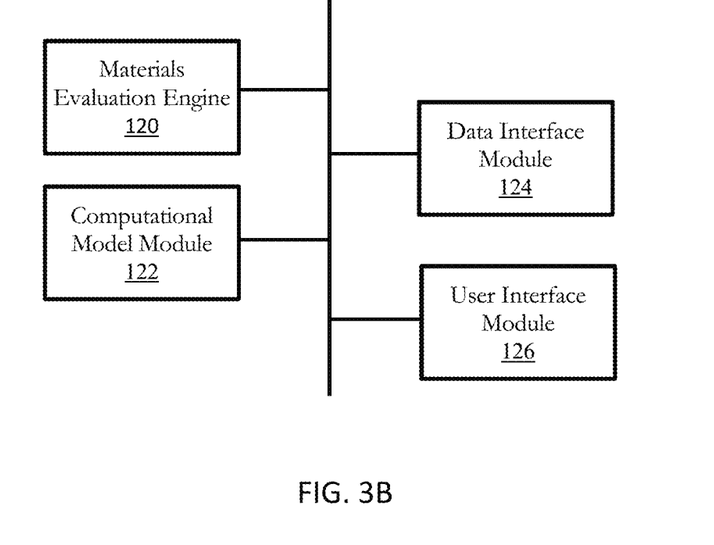

FIG. 3B depicts an example block diagram including a materials evaluation engine 120, a computational model module 122, a data interface module 124, and a user interface module 126. Such exemplary components may be stored in memory as program instructions and executed by a processor for the materials analysis program. The materials evaluation engine 120 includes logic for controlling the materials analysis program. Optionally, the module and engine blocks may be comprised of specialized hardware components for executing such specific functions. The materials evaluation engine 120 is operatively coupled to the computational model module 122, the data interface module 124, and the user interface module 126.

The computational model module 122 includes program instructions to evaluate a material. The data interface module provides an applications programming interface to the materials evaluation engine 120 to access data storage devices, and may further provide program instructions and data storage for the other modules. The user interface module 126 provides an application programming interface to receive user input (e.g., through a user interface device 108) and to provide output to the user (e.g., through a display device 106). User input may include a request for the system 100 to perform the evaluation of at least one, and possibly many, materials. Output from the user interface module 126 may include a score and/or qualitative feedback of the combination of two materials.

In some example embodiments, the program of system 100 may proceed in stages. In such embodiments, the program first evaluates the electrochemical stability of the electrolyte by itself by subjecting it to Li chemical potentials ($\mu_{Li}$) that can be observed at the anode or cathode. The evaluation of electrochemical stability evaluation may be performed by computational modeling. After the evaluation of electrochemical stability, the model may be extended to allow chemical reaction between the electrolyte and electrodes. The reactivity of the bulk phases is considered, as the contribution of the actual interfacial energy is small compared to the large driving forces for instability that may be found. For example, considering an upper bound for the change in surface energy of 0.5 J m$^{-2}$ with an atomically thin interfacial product, the contribution to the total energy remains only about 100 meV per atom.

Figure 4A:
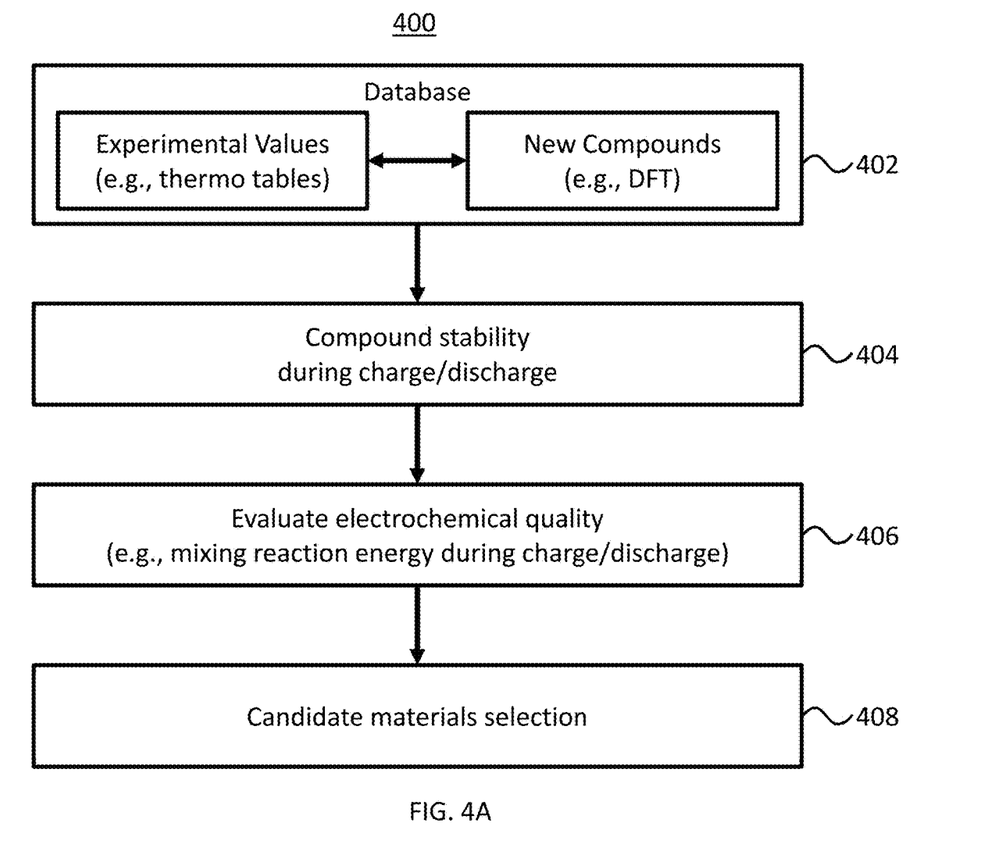
FIGS. 4A and 4B depict flow diagrams illustrating a method of evaluating electrochemical qualities for interphase products.
Figure 4B:
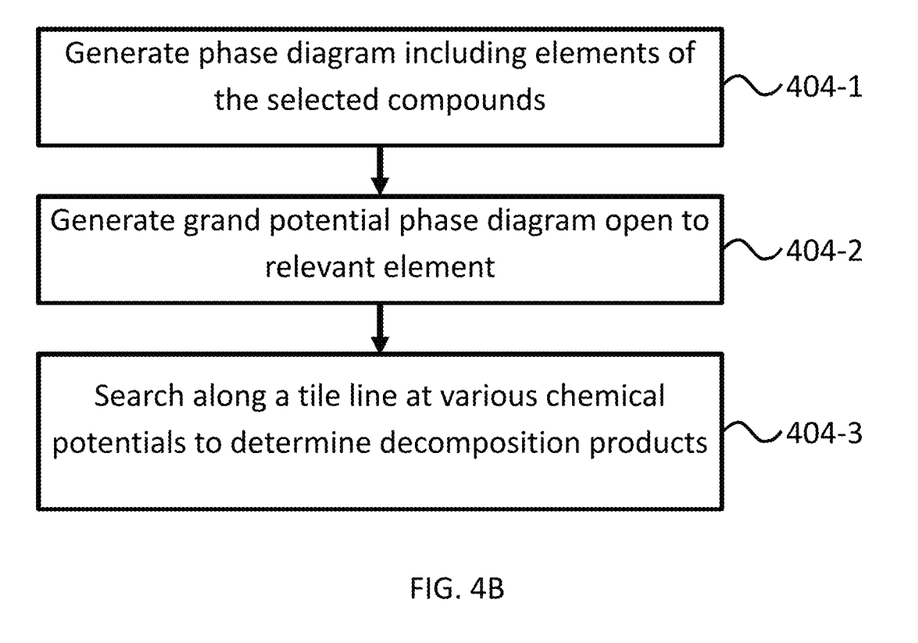

FIGS. 4A and 4B are flow diagrams illustrating a method of evaluating electrochemical qualities for interphase products, in accordance with some embodiments. In some embodiments, the method 400 is performed by one or more electronic devices, servers, and/or systems (e.g., system 100, FIGS. 3A and 3B). Thus, in some implementations, the operations of the method 400 described herein are entirely interchangeable, and respective operations of the method are performed by any one or combination of the aforementioned devices, servers, and systems. For ease of reference, the methods herein will be described as being performed by an electronic device. FIGS. 4A and 4B correspond to instructions stored in a computer memory or other computer-readable storage medium (e.g., main memory 104 of system 100).

The device receives (e.g., via a user interface 108 of system 100, FIG. 3A) a selection of a plurality of chemical phases for a solid electrolyte and at least one of an anode and cathode. The solid electrolyte, the anode, and the cathode compose an electrochemical cell (e.g., FIG. 1A). In some implementations, the plurality of chemical phases includes an alkali element. In some implementations, the alkali element is selected from the group consisting of lithium and sodium.

Thermodynamic data is retrieved (402) for the plurality of chemical phases from a database. The data may be retrieved from a storage device associated with the electronic device (e.g., storage device 112, FIG. 3A) and/or a remote storage device (e.g., a remote server distinct from system 100 that stores the thermodynamic data).

Optionally, respective stability ranges for a plurality of candidate phases for a solid electrolyte are calculated (404) (e.g., during charging/discharging). Based on the calculated stability ranges, a chemical phase whose calculated stability range satisfies a predefined criterion is identified from the plurality of candidate phases. In these implementations, the selected chemical phase corresponds to the identified chemical phase.

A respective electrochemical quality for at least one of an interface between the solid electrolyte and the anode (e.g., electrolyte and anode in FIG. 1A), and an interface between the solid electrolyte and the cathode (e.g., electrolyte and cathode in FIG. 1A), is evaluated (406) using the retrieved thermodynamic data (e.g., determining a mixing reaction energy during charging/discharging of the electrochemical cell). Various embodiments for evaluating electrochemical qualities are described in greater detail with respect to FIG. 4B.

Based on the evaluation, a combination of candidate chemical phases (e.g., for the electrolyte, anode, and/or cathode) is selected (408) (or identified) for an electrochemical cell. Additionally and/or alternatively, an indication of the identified combination of candidate chemical phases is provided (e.g., for display on system 100, FIG. 3A). Various embodiments for identifying the combination of candidate chemical phases (e.g., identifying a combination of chemical phases that satisfies a stability criterion) is described in greater detail throughout.

FIG. 4B is a flow diagram illustrating one or more steps for evaluating (406, FIG. 4A) at least one electrochemical quality using retrieved thermodynamic data, in accordance with some embodiments.

In some embodiments, the electrochemical quality is a degree of thermodynamic stability, and using the retrieved thermodynamic data to evaluate the respective electrochemical quality comprises determining a mixing reaction energy for at least one of the interface between the solid electrolyte and the anode, and the interface between the solid electrolyte and the cathode. In these embodiments, the mixing reaction energy provides an indication of the degree of thermodynamic stability.

Figure 5A:
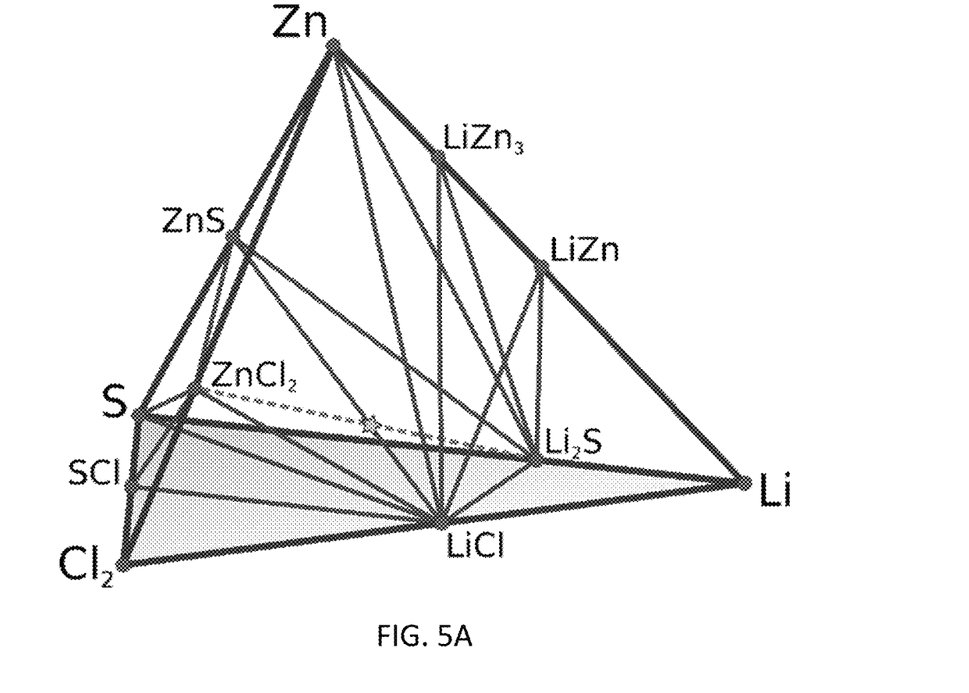
FIGS. 5A and 5B illustrate exemplary phase diagrams for evaluating electrochemical qualities for interphase products.

In some implementations, determining the mixing reaction energy comprises generating (404-1) a phase diagram based on elements of the corresponding chemical phases of the interface or interfaces being evaluated (e.g., phase diagram shown in FIG. 5A). Based on the phase diagram, a grand potential phase diagram open to a selected element is generated (404-2) (e.g., grand potential phase diagram shown in FIG. 5B). Furthermore, a stable combination of chemical phases corresponding to the composition of the mixture (e.g., cell in FIG. 1A) is identified (and optionally, an indication of the stable combination is provided, step 408, FIG. 4A) by using the phase diagram and/or the grand potential phase diagram.

In some implementations, using the phase diagram to identify the stable combination comprises identifying in the phase diagram a tie line connecting the chemical phases of the stable combination (detailed example of the method 400 is described below with respect to FIGS. 5A and 5B).

In some embodiments, identifying the stable combination of chemical phases includes identifying a combination of chemical phases satisfying a thermodynamic stability criterion. The stability criterion may be a decomposition energy threshold value, a combination of chemical phases having a greatest or smallest determined value relative to those of other combination (e.g., max/min mixing energy when combining two materials), or a combination of chemical phases that is closest to a predefined value among other combination (e.g., combination whose decomposition energy closest to 0). The stability criterion may be based on other metrics or measurable aspects.

In some embodiments, determining the mixing reaction energy comprises determining respective mixing reaction energies for multiple combinations of chemical phases, the multiple combinations formed based on elements of the selected plurality of chemical phases (e.g., various compounds based on elements/compounds Li, Zn, S, $CL_2$, FIG. 5A). A first combination from the multiple combinations of chemical phases that satisfies a thermodynamic stability criterion is identified (e.g., LiCl and ZnS, FIG. 5A). In other words, mixing reaction energies are determined for multiple combinations of chemical phases, and the combination(s) satisfying the thermodynamic stability criterion are identified.

In some embodiments, the electrochemical quality is an ionic transport conductivity (e.g., of a solid electrolyte interphase product, of the evaluated mixture for the electrochemical cell, etc.), and using the retrieved thermodynamic data to evaluate the respective electrochemical quality comprises identifying a combination of chemical phases (or multiple combinations of chemical phases) that satisfies a threshold ionic transport conductivity (e.g., minimum of 0.001 mS/cm at room temperature).

Figure 5B:
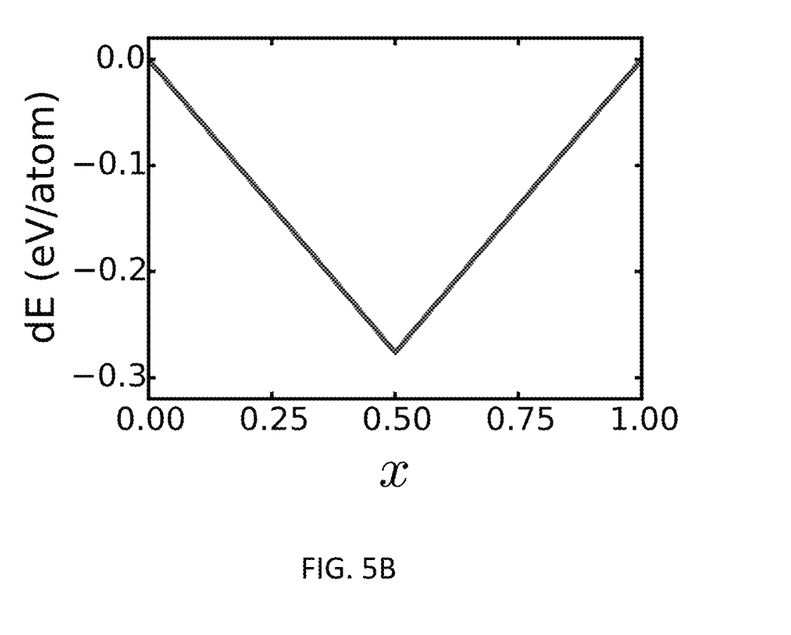

The examples illustrated in FIGS. 5A and 5B are described with reference to various embodiments of the method 400 (FIGS. 4A and 4B).

Stability Versus Lithium Potential

In an example, the method described above may be used to evaluate lithium-based electrochemical cells. High energy density batteries sometimes have anodes and cathodes with different lithium electrochemical potential. The effects of subjecting the electrolyte to lithium potentials, without allowing other reactions between the electrolyte and the anode or cathode material are considered. Particularly, in some implementations, after receiving a selection of a plurality of chemical phases for a solid electrolyte and at least one of an anode and cathode, and after thermodynamic data is retrieved for the plurality of chemical phases from a database (step 402, FIG. 4A), a stability window may optionally be determined (e.g., step 404, FIG. 4A). The stability window may be determined based on the voltages at which lithium is extracted from the electrolyte to form a Li-deficient decomposition layer between the electrolyte and the cathode (see FIG. 1A, anodic stability), and at which lithium is inserted into the electrolyte, reducing another species and forming a Li-reduced decomposition layer (see FIG. 1B, cathodic stability).

Figure 1A:
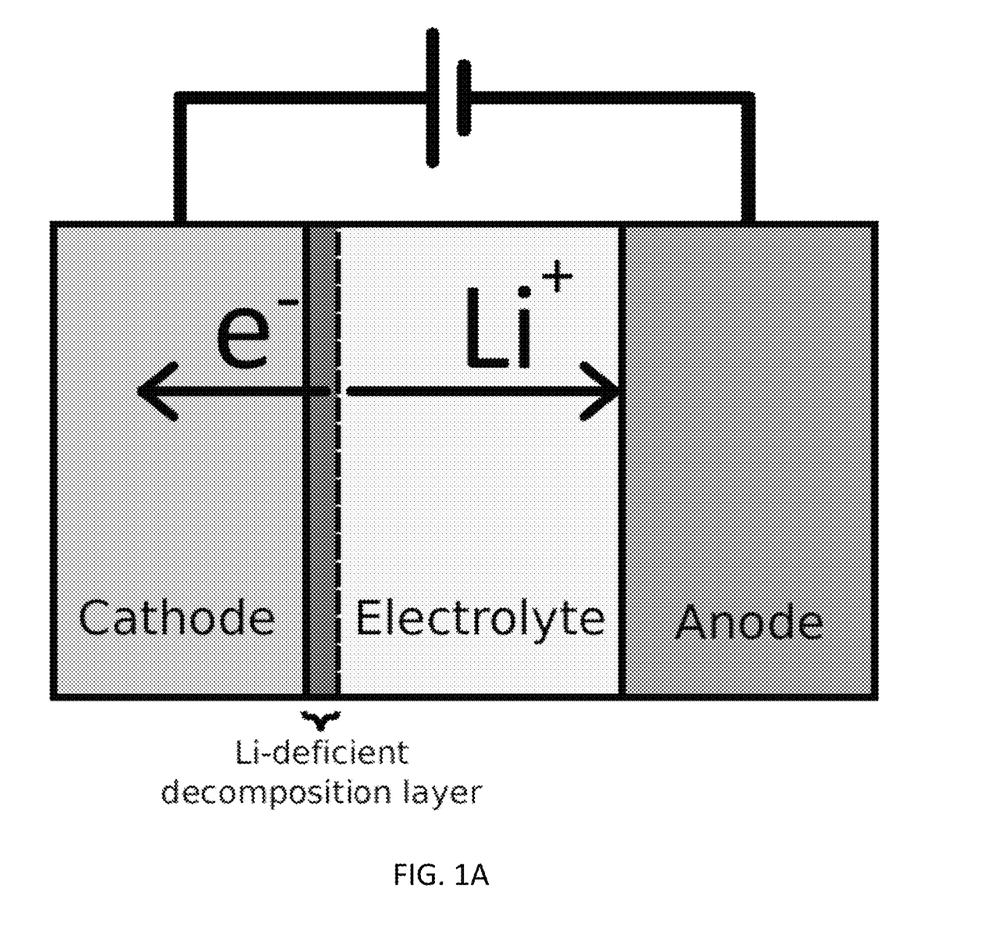
FIGS. 1A, 1B, and 1C, show exemplary electrochemical windows and voltage ranges associated with solid electrolytes that may be evaluated using the methods, systems, and media described herein.
Figure 1B:
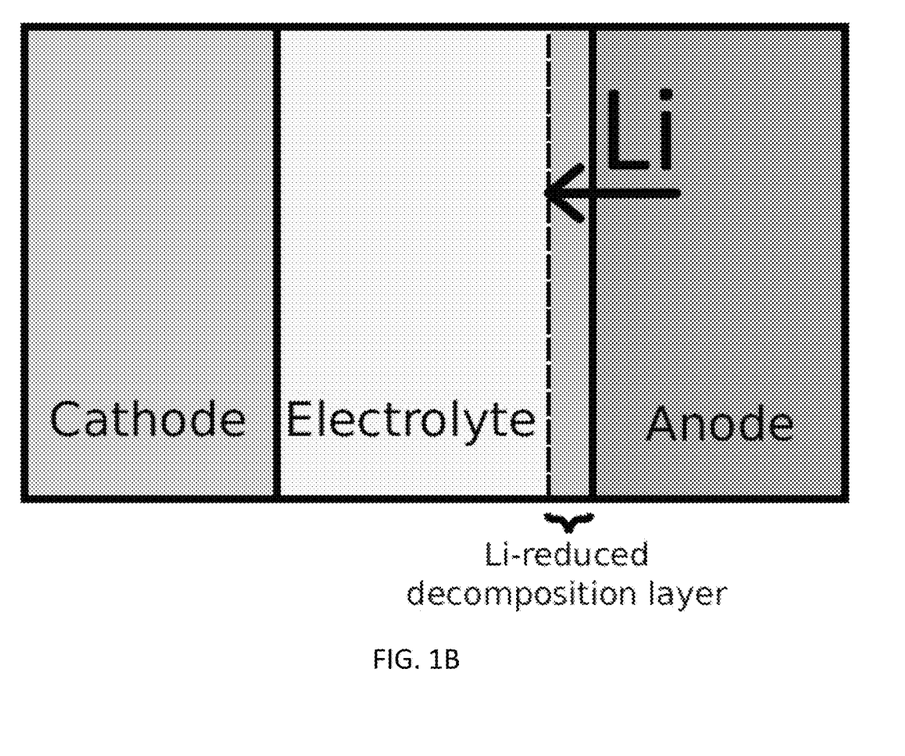

FIG. 1A illustrates an exemplary schematic of a cell showing decomposition of the electrolyte at the electrolyte-cathode interface during charging. FIG. 1B illustrates an exemplary schematic of a cell showing the reduction of the electrolyte by the lithium metal anode.

In some implementations, for each considered electrolyte, the range of $\mu_{Li}$ over which the electrolyte is found to be stable is calculated by constructing the relevant 0 K grand potential phase diagrams. The grand potential $\Phi$ of materials open to Li at applied voltages between 0 V and 7 V vs Li/Li+ ($\mu_{Li}$ between 0 and −7 eV vs Li metal) according to equation 1, in which E[c] is the enthalpy and $n_{Li}$[c] the lithium concentration of composition c, and $\mu_{Li}$ the lithium chemical potential. Phase diagrams may be constructed using a thermodynamic database of Density Functional Theory (DFT) computed bulk energies of materials with crystal structures obtained from the Inorganic Crystal Structure Database (ICSD) and those generated by applying data-mined chemical substitutions. Various crystalline compounds in a given chemical space are included in the ICSD. Similar datasets can be used (e.g., Materials Project).

$$\Phi[C, \mu_{Li}] = E[c] - n_{Li}[c]\mu_{Li} \quad (1)$$

For any lithium potential $\mu_{Li}$, the lower convex hull of $\Phi$ in composition space is computed. Materials that are on the convex hull in $\Phi$ composition space are stable in contact with a lithium reservoir at $\mu_{Li}$.

Figure 1C:
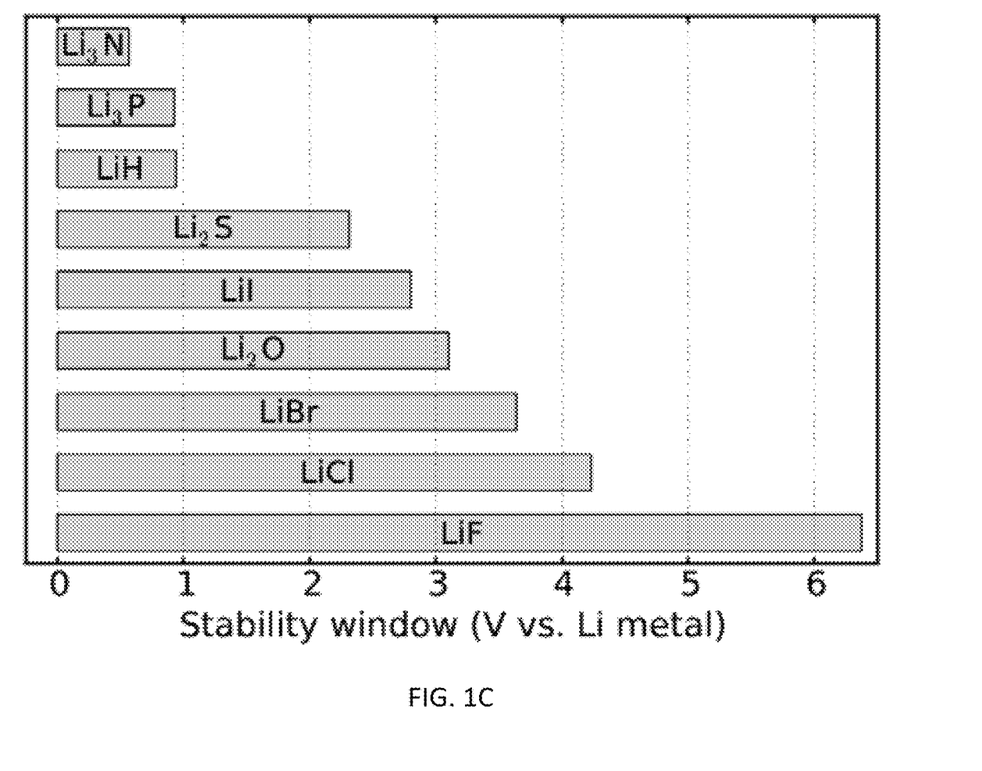

Electrolyte materials calculated by DFT to be metastable at 0 K (e.g., $Li_{10}GeP_2S_{12}$) are placed on the convex hull for the stability and reaction energy calculations to account for the small changes in free energy when going from 0 K to elevated temperature. As a simple example, the stability ranges for common ionic lithium binary materials are shown in FIG. 1C. In these binary materials, the anion is fully reduced so further reaction with lithium metal cannot occur and they are therefore stable down to 0 V. At voltages above the stability window, lithium is extracted from these materials yielding the oxidized anion, shown schematically in FIG. 1A. These results are in agreement with the view that halide anions are the most stable at high potential, and materials such as sulfides, nitrides, and phosphides display low anodic limits.

To evaluate the stability of technologically relevant electrolytes, grand potential phase diagrams for a broad range of known solid-electrolyte chemistries may be constructed (e.g., using the pymatgen software package). Furthermore, to obtain bulk energies, DFT software may be used within the Projector Augmented Wave (PAW) formalism using a generalized gradient approximation to the exchange-correlation energy as implemented (e.g., in the Vienna Ab Initio Simulation Package (VASP)) to calculate the formation energy of each electrolyte from the nearest phases present (e.g., in the NIST-JANAF or Kubaschewski thermochemical tables or from the elements). In this example, a cutoff energy of 520 eV and a k-point grid of at least 500/n-atoms were used for all calculations.

A mixing scheme may be used to combine generalized gradient approximation (GGA) calculations with the rotationally invariant Hubbard (+U) correction to properly treat insulators and metals. The nearest phases may be uniquely defined as those that define the Gibbs triangle (the low energy facet) containing the desired composition in the phase diagram. The phase diagram may be generated using only materials for which the experimental formation energy is available, using the DFT computed energies to determine the convex hull.

As an example, to calculate the formation energy of $LiYF_4$ (a compound whose formation energy is not present in the experimental tables), DFT is used to calculate the energy of the reaction and the experimental formation energies of LiF and $YF_3$ are added. This method sometimes results in a more accurate formation energy than computing the reaction from the elements since DFT reaction energies may have improved accuracy when considering the energetics of systems in which the oxidation state of ions is unchanged. For $Li_3PS_4$ and similar materials, where the formation energy of $Li_2S$ is present in the thermochemical tables but $P_2S_5$ is not, DFT may be used to calculate the energy of the reaction This strategy results in using the experimentally determined formation energy directly. Maximal predictive capability may be achieved by using experimental energies, supplemented with DFT calculated formation energies when experimental thermochemical data is unavailable.

Figure 2:
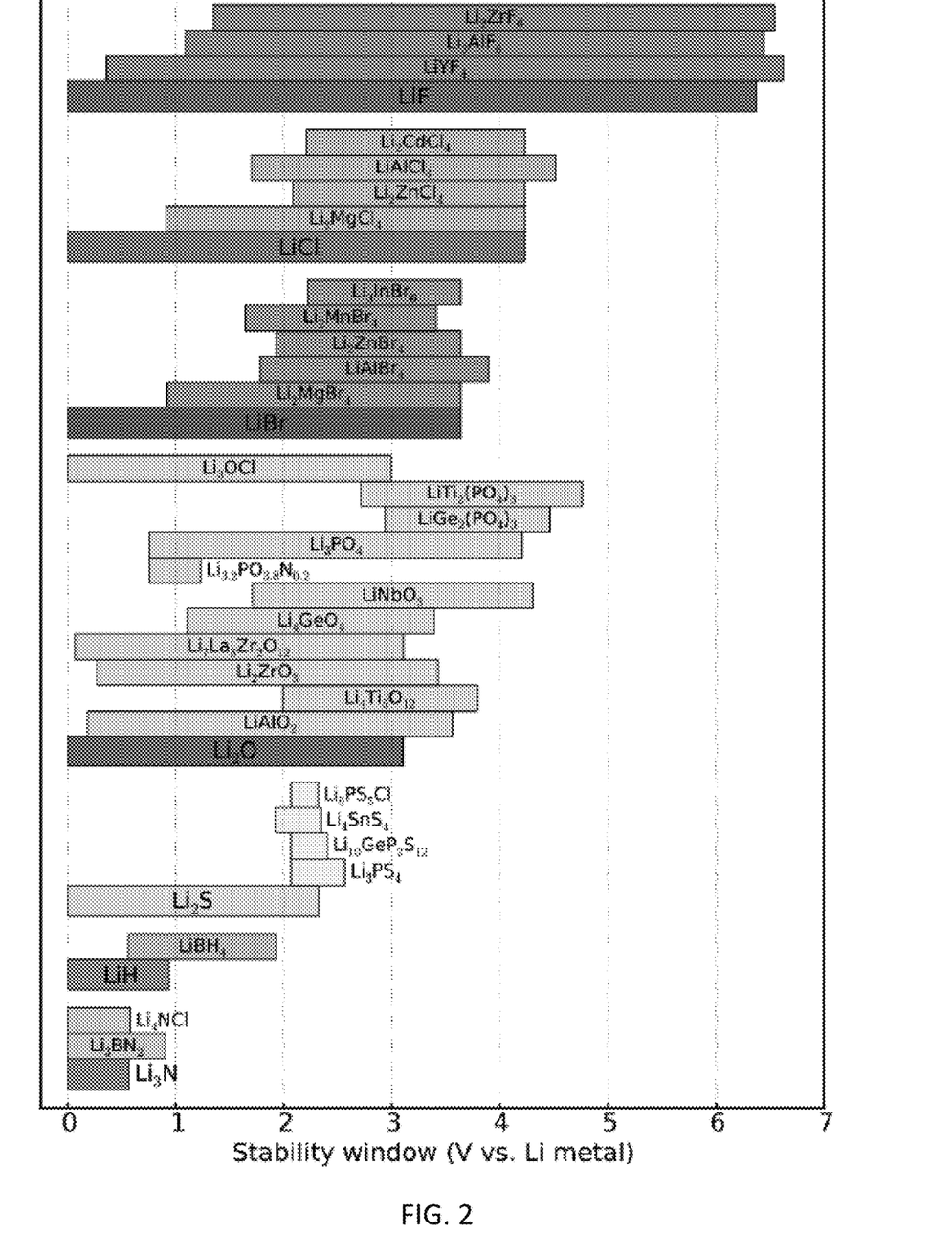
FIG. 2 shows additional electrochemical data associated with solid electrolytes that may be generated and/or used by the methods, systems, and media described herein.

Examples of calculated stability ranges for a number of solid-electrolyte materials are shown in FIG. 2. In some batteries, the electrolyte must be stable at lithium potentials between an anode chemical potential close to 0 eV/atom for lithium metal and the lithium potential set by the cathode, for example a value of about −4 eV/atom for a layered oxide. It has been found in some cases that the anodic stability is determined primarily by the stability window of the related binary, or in the case of mixed anion materials, by the stability window of the least stable related binary material. For example, the anodic stability of $Li_6PS_5Cl$ is determined primarily by the stability of $Li_2S$.

In this example process, removal of lithium from the electrolyte overcomes both the formation energy of $Li_nX$ and the energy of mixing with the other binary materials. The energy of mixing widens the electrochemical window over which the electrolyte is stable. In most cases this mixing energy is small and the anodic limit is close to that of the binary. However, materials with strongly bound polyanions such as the phosphates and $LiBH_4$ have much wider stability windows since extraction of Li is accompanied by the dissociation of this polyanion, except for electrolytes that can lose lithium by oxidation of another of their components, for example oxidation of $Mn^{2+}$ in $Li_2MnBr_4$. Anodic stability is predicted to increase with increasing anion electronegativity.

The stability windows of the electrolyte may not to extend to the voltages of the anode and cathode. $Li_3PS_4$ and $Li_3PO_4$ are predicted to be unstable against Li-metal from calculations, but these materials are known experimentally to form a stable interface. Expected decomposition products of $Li_2S$/$Li_2O$ and $Li_3P$ include compounds that include elements of Li, S, P, and/or O in various stoichiometric proportions. $Li_3P$ is a known ionic conductor, so it may passivate the decomposition reaction and result in a stable interface still able to conduct lithium.

Stability in Contact with Electrodes

The $\mu_{Li}$ stability window yields great insight into the performance of an electrolyte in real battery systems, but may not consider the more complex reactions that may occur between electrolyte and cathode. At the interface between two phases, there is the possibility of reaction to form an intermediate phase or equilibrium of intermediate phases. The model may be extended to investigate the driving forces for such reactions (e.g., evaluating a respective electrochemical quality, such as mixing reaction energy, for interfaces formed within the electrochemical cell, step 406, FIG. 4A).

Since the reaction can consume arbitrary amounts of either phase, energy is considered for all possible reactions, energy of the form $$xc_a + (1-x)c_b \rightarrow c_{equil}$$

where $c_a$ and $c_b$ are the compositions of the two phases in contact, $c_{equil}$ the low energy phase equilibrium determined from the phase diagram, and x is a mixing parameter which can vary between 0 and 1, for example. The reaction of this form is calculated with the highest driving force, given by equation 2 (see below). In this equation, the function $E_{pd}[c]$ describes the energy of the ground state structure or phase equilibrium at composition c determined from the phase diagram. Essentially, this approach may identify the product that forms with the largest driving force when combining two materials.

$$\Delta E[c_a, c_b] = \underset{x \in [0,1]}{\text{MIN}} \{E_{pd}[xc_a + (1-x)c_b] - xE[c_a] - (1-x)E[c_b]\} \quad (2)$$

As an illustration of the approach represented by equation 2, consider the example of an interface of $Li_2S$ with $ZnCl_2$. The calculated quaternary phase diagram is shown in FIG. 5A. The products of the mixing reaction may be found anywhere between $Li_2S$ and $ZnCl_2$ in the quaternary phase diagram. The resulting reaction energies may be obtained from the phase diagram and plotted as a function of the mixing parameter (e.g., steps 404-2 in FIG. 4B, grand phase diagram in FIG. 5B). In this example, the interface is not thermodynamically stable and will react to form the lower energy equilibrium of 2 LiCl+ZnS with a driving force of 0.27 eV atom$^{-1}$. In contrast, an interface between LiCl and ZnS is predicted to be thermodynamically stable, as shown by a tieline connecting those phases in FIG. 4B.

In some embodiments, the interface system is open to lithium. Equation 2 may be used to represent an interface system open to lithium by replacing $E_p d[c]$ and $E[c]$ with their corresponding quantities under the grand potential, $\Phi_{pd}[c, \mu_{Li}]$ and $\Phi[c, \mu_{Li}]$. Similar to $E_{pd}[c]$, $\Phi_{pd}[c, \mu_{Li}]$ describes the energy of the ground state structure or phase equilibrium at composition c and lithium chemical potential $\mu_{Li}$, as determined from the grand-potential phase diagram and equation (3) below. The lithium potential is applied as determined by the computed average cathode voltage. During cycling, the lithium chemical potential is a function of depth of discharge, but this effect on the reaction energy is small. Because the system is open to Li, reaction energies are normalized by the number of non-Li atoms. The resulting expression shown in equation (4) is the change in the grand potential of the interfacial region after allowing the electrolyte to equilibrate with the external lithium potential and react with the cathode and determines the interfacial stability as a function of $\mu_{Li}$.

$$\Phi_{pd}[c, \mu_{Li}] = \underset{n_{Li}}{\text{MIN}} \{E_{pd}[c + n_{Li}] - n_{Li}[c]\mu_{Li}\} \quad (3)$$

$$\Delta\Phi[c_{cathode}, c_{electrolyte}, \mu_{Li}] = \quad (4)$$
$$\underset{x \in [0,1]}{\text{MIN}} \{\Phi_{pd}[xc_{cathode} + (1-x)c_{electrolyte}, \mu_{Li}] -$$
$$x\Phi[c_{cathode}, \mu_{Li}] - (1-x)\Phi[c_{electrolyte}, \mu_{Li}]\}$$

The magnitude of $\Delta\Phi$ provides one indication of the thermodynamic stability of the interface. A further understanding of the two contributions to the value of $\Delta\Phi$ may be obtained by a comparison to $\Delta\Phi_{no\ mixing}$ as shown in equation (5). In Equation (5), cathode-electrolyte mixing is not allowed by enforcing x=0 in equation 4. $\Delta\Phi_{no\ mixing}$ measures only the reaction energy from equilibration with the external lithium reservoir, and is therefore correlated with the distance between the cathode voltage and the stability range of the electrolyte shown in FIG. 2. FIG. 2 illustrates exemplary electrochemical stability ranges of various electrolyte materials grouped by anion, with a corresponding binary for comparison. The high-voltage stability of these materials may be determined primarily by the anion. The predicted anodic and cathodic reactions that determine these stability windows may be found in table S2 in the Appendix. The magnitude of $\Delta\Phi$ may be at least as large as $\Delta\Phi_{no\ mixing}$. In systems where $\Delta\Phi$ and $\Delta\Phi_{no\ mixing}$ are approximately equal, the driving force from decomposition arises mainly from extraction or insertion of lithium as opposed to reaction with the electrode composition.

$$\Delta\Phi_{no\ mixing}[c_{electrolyte}, \mu_{Li}] = \Phi_{pd}[c_{electrolyte}, \mu_{Li}] - \Phi[c_{electrolyte}, \mu_{Li}] \quad (5)$$

Results of calculations of $\Delta\Phi$ for various cathode/electrolyte combinations are shown in the Appendix. As suggested by the calculated results, electrolyte materials that are predicted to be stable at the cathode voltage show low reaction energies as they come entirely from the mixing of cathode and electrolyte compositions and do not involve redox activity. Thiophosphate materials tend to have high reaction energies as a result of applying the cathode lithium potential, but also from strong reactions between the $PS_4$ groups and oxide cathodes to form $PO_4$ groups and transition metal sulfides. The details of these predicted reactions can be found in the supplementary information table in the Appendix. For the sulfide electrolytes, the largest reaction energies are with the layered $LiCoO_2$ and $LiNiO_2$ due to their high voltage, but even against $LiFePO_4$ these electrolytes are unstable. In contrast, the oxide materials are considerably more stable.

In some embodiments, a correlation exists between cycle life and the magnitude of the calculated decomposition energy. The stability range for the thiophosphate electrolytes, for example, are generally very narrow, with predicted stability only between 2 and 2.5 V vs. Li metal. In these systems, including $Li_4SnS_4$ or $Li_{10}GeP_2S_{12}$ electrolytes, oxide coatings on the cathode and high voltage (low $\mu_{Li}$) anode materials, for example indium metal, are preferably used. In some implementations, $Li_{10}GeP_2S_{12}$ may be used as an anode, cathode, and electrolyte in a battery, with carbon added to increase the electrical conductivity of the electrode materials.

Some full-cell configurations have been shown experimentally to require minimal overpotential and to exhibit good cycle life. A cell utilizing $Li_2TiS_2$ cathode with $Li_2S—P_2S_5$ electrolyte has been shown to be relatively stable over many cycles even at elevated temperatures. Calculations predict only a small driving force for insertion of lithium into the $Li_3PS_4$ electrolyte due to the very low voltage of the cathode. The $Li_3PS_4$ electrolyte is chemically similar to a $Li_2S$—$P_2S_5$ glass. Good performance has also been achieved in a wide variety of cells using a LiPON electrolyte calculated to be relatively stable except for the formation of a passivating layer of $Li_3PO_4$ at high voltages. As suggested by these examples, the decomposition reaction may be examined for passivating products that retain Li-ion conductivity.

The preceding examples of thermodynamic analysis can be applied to finding mitigating solutions for predicted reactions of electrolyte/electrode combinations, such as coating materials for electrolyte and electrode (both cathode and anode) materials. For example, a cathode coating such as $Li_4Ti_5O_{12}$, $LiAlO_2$, $LiTaO_3$, or $LiNbO_3$ may be used at the cathode-electrolyte interface. FIG. 2 shows why such a barrier layer is effective in some implementations: the stability window of these examples is wider than any of the sulfide materials, and all of these are stable at oxide cathode voltage.

Discussion of Experimental Results

Interfacial stability is a problem for solid state battery devices. In example embodiments, a predictive approach is used to establish the electrochemical and chemical reactivity between electrodes and electrolytes. Thermodynamic analysis of electrolyte materials enables an understanding of the processes governing interfacial stability, and is easily scalable to examine electrolyte/electrode combinations across a wide range of chemical systems. In examples disclosed herein, DFT may be combined with experimental data to expand the thermodynamic data available for analysis. The same methods can be applied to purely experimental thermochemistry data in systems where it is available.

One area of battery research is the use of newly developed thiophosphate materials having extremely high lithium conductivity in conjunction with relatively high voltage cathodes. These interfaces have two pathways leading to device failure. First, considering only the lithium chemical potentials experienced by the electrolyte, attempting to charge a typical oxide cathode is likely to lead to the formation of a passivating but highly resistive sulfur layer by lithium extraction. In contact with an oxide cathode, mixing of the cathode and electrolyte is also to be expected due to the high stability of the phosphate anion and $Li_3PO_4$ phases. This is in good agreement with experimental observation of P and Co transport across the interface in a $LiCoO_2/Li_2S$—$P_2S_5$ battery.

There has been speculation that the interfacial resistance is caused by a space charge region with Li segregation into the cathode decreasing conductivity. While this segregation is certainly possible and is likely to occur to some extent, it would result in an increase in conductivity by increasing the number of charge carriers. Calculations in some experiments suggest that complete breakdown of the electrolyte including oxidation of $S^{2-}$ to form a blocking layer is more likely at the chemical potentials of typical oxide cathode materials. Commonly, cyclic voltammetry is used to evaluate and report electrolyte stability. Somewhat surprisingly given the inherent stability limitations of the sulfide materials, extremely wide stability windows have been reported, in some reports extending as high as 10 V vs. Li metal. This may be caused by a thin layer of oxidized, lithium deficient, electrolyte at the electrode, for example elemental sulfur in systems containing thiophosphate electrolytes. Such an interfacial layer will significantly impede lithium mobility, so CV curves may be augmented by Li transport measurements at these high voltages to confirm electrolyte function under extreme applied potentials.

One difficulty in finding a good solid electrolyte is finding one that is stable at both the cathode and anode. Based on one set of experimental results, the $Li_7La_3Zr_2O_{12}$ garnet and $LiAlO_2$ materials meet the stability requirements for high voltage cathodes, though both of these suffer from high resistivity grain boundaries and difficult processing requirements. Because of its chemical similarity to $LiAlO_2$, ion exchanged Li β"-alumina also shows a wide stability window but with higher room temperature conductivity. The binary halides have extraordinarily wide stability windows, but ionic conductivity is prohibitively low for all but the lowest power applications unless a second cation is added. Unfortunately, the addition of such a cation typically makes these materials unstable against reduction by low voltage anodes.

In some embodiments, cathode coatings improve the performance of high voltage electrolytes by isolating the electrolyte materials from the low lithium potential, and imperfections in the coating allow reactions between cathode and electrolyte that yield passivating and ionically insulating reaction products. Because of this resilience to imperfections, thin coatings of lower conductivity materials can be used. Coating of the anode is in sometimes more difficult in principle because lithium reduction of the electrolyte usually yields an electronically conductive (and therefore not passivating) decomposition product. One solution to this problem may be to combine two electrolytes in a single cell such that the high-voltage electrolyte protects the low-voltage electrolyte from oxidation, and the low-voltage electrolyte protects the other from reduction. Due to the thickness of the electrolyte vs. a barrier coating, both materials may have high ionic conductivity. One such solution would be to use a combination of $Li_3PS_4$ against the anode, and $Li_2MgCl_4$ against the cathode. The $Li_2MgCl_4$ protects the $Li_3PS_4$ from oxidation by the cathode, and $Li_3PS_4$ protects the $Li_2MgCl_4$ from reduction by the anode.

While complete thermodynamic stability of the bulk electrolyte and cathode phases in contact with each other is ideal, this is sometimes difficult to achieve and calculations from some experiments indicate that this is likely not the case in some high performing systems. In batteries utilizing thiophosphate electrolytes calculations show that the anode is likely to reduce the electrolyte. In cells using a LIPON electrolyte, oxidation of nitrogen by the high cathode voltage is predicted. In both of these cases, the decomposition products are electronically insulating and have significant lithium concentration, and so can support lithium ion conductivity. Optimization of the electrolyte/electrode combinations to produce similar passivating decomposition products may be a viable route towards creating high-performance systems and overcoming bulk chemical incompatibilities. Results suggest a few combinations of known cathode and electrolyte materials that may be combined to create high-performance batteries which have not been previously attempted. One such combination is that of $Li_3PS_4$ or the higher conductivity $Li_7P_3S_{11}$ glass-ceramic electrolyte combined with $LiVS_2$. This combination shows minimal decomposition energy. This cell is expected to have a higher voltage and slightly better stability than the similar $LiTiS_2$ cathode with $Li_2S$—$P_2S_5$ electrolyte, which is also predicted by calculations to have good performance, and was able to cycle for over 50 cycles without a barrier coating. Another possible combination predicted by calculations is a $LiBH_4$—$LiTiS_2$ cell. $LiBH_4$ is unstable against the high voltage of $LiCoO_2$ and a steadily increasing interfacial resistance is seen, but is predicted to be more stable against the lower voltage $LiTiS_2$.

It is to be understood that, the foregoing description merely illustrates and does not limit the scope of the embodiments described. Numerous alternatives and equivalents exist. Other aspects, advantages, and modifications will be apparent to those skilled in the art to which the embodiments pertain. Furthermore, although some of various drawings illustrate a number of logical stages in a particular order, stages are not order dependent in all embodiments and may be reordered. In some cases, stages may also be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

What is claimed is:

1. A method, comprising:
at a device having one or more processors and memory storing instructions for execution by the one or more processors:
receiving a selection of a plurality of chemical phases for a solid electrolyte and at least one of an anode and cathode, wherein the solid electrolyte, the anode, and the cathode compose an electrochemical cell;
retrieving thermodynamic data for the plurality of chemical phases from a database; and
using the retrieved thermodynamic data to evaluate a respective electrochemical quality for at least one of an interface between the solid electrolyte and the anode, and an interface between the solid electrolyte and the cathode.

2. The method of claim 1, wherein the electrochemical quality is a degree of thermodynamic stability, and using the retrieved thermodynamic data to evaluate the respective electrochemical quality comprises:
determining a mixing reaction energy for at least one of the interface between the solid electrolyte and the anode, and the interface between the solid electrolyte and the cathode, wherein the mixing reaction energy provides an indication of the degree of thermodynamic stability.

3. The method of claim 2, wherein determining the mixing reaction energy comprises:
generating a phase diagram based on elements of the corresponding chemical phases of the interface or interfaces being evaluated;
based on the phase diagram, generating a grand potential phase diagram open to a selected element; and
using the phase diagram and/or the grand potential phase diagram to identify a stable combination of chemical phases corresponding to the composition of the mixture.

4. The method of claim 3, wherein using the phase diagram to identify the stable combination comprises identifying in the phase diagram a tie line connecting the chemical phases of the stable combination.

5. The method of claim 3, wherein the electrochemical quality is an ionic transport conductivity of a solid interphase compound product.

6. The method of claim 5, wherein the conductivity is greater than about 0.001 mS/cm at room temperature.

7. The method of claim 2, wherein determining the mixing reaction energy comprises determining respective mixing reaction energies for multiple combinations of chemical phases, the multiple combinations formed based on elements of the selected plurality of chemical phases, the method further comprising:
identifying a first combination from the multiple combinations of chemical phases that satisfies a thermodynamic stability criterion.

8. The method of claim 1, wherein the plurality of chemical phases includes an alkali element.

9. The method of claim 8, wherein the alkali element is selected from the group consisting of lithium and sodium.

10. The method of claim 1, further comprising:
calculating respective stability ranges for a plurality of candidate phases for a solid electrolyte; and
based on the calculated stability ranges, identifying, from the plurality of candidate phases, a chemical phase whose calculated stability range satisfies a predefined criterion, wherein the selected chemical phase corresponds to the identified chemical phase.

11. The method of claim 1, wherein the solid electrolyte is a coated electrolyte, the anode is a coated anode, and the cathode is a coated cathode.

12. A system, comprising:
a processor; and
memory for storing one or more programs for execution by the processor, the one or more programs including instructions for:
receiving a selection of a plurality of chemical phases for a solid electrolyte and at least one of an anode and cathode, wherein the solid electrolyte, the anode, and the cathode compose an electrochemical cell;
retrieving thermodynamic data for the plurality of chemical phases from a database; and
using the retrieved thermodynamic data to evaluate a respective electrochemical quality for at least one of an interface between the solid electrolyte and the anode, and an interface between the solid electrolyte and the cathode.

13. A non-transitory computer readable storage medium storing one or more programs for execution by one or more processors, the one or more programs including instructions for:
receiving a selection of a plurality of chemical phases for a solid electrolyte and at least one of an anode and cathode, wherein the solid electrolyte, the anode, and the cathode compose an electrochemical cell;
retrieving thermodynamic data for the plurality of chemical phases from a database; and
using the retrieved thermodynamic data to evaluate a respective electrochemical quality for at least one of an interface between the solid electrolyte and the anode, and an interface between the solid electrolyte and the cathode.

* * * * *